US009236217B2

(12) United States Patent  
Ominami et al.

(10) Patent No.: US 9,236,217 B2  
(45) Date of Patent: Jan. 12, 2016

(54) INSPECTION OR OBSERVATION APPARATUS AND SAMPLE INSPECTION OR OBSERVATION METHOD

(71) Applicant: HITACHI HIGH-TECHNOLOGIES CORPORATION, Tokyo (JP)

(72) Inventors: Yusuke Ominami, Tokyo (JP); Mami Konomi, Tokyo (JP); Sukehiro Ito, Tokyo (JP); Tomohisa Ohtaki, Tokyo (JP); Shinsuke Kawanishi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/562,260

(22) Filed: Dec. 5, 2014

(65) Prior Publication Data

US 2015/0083908 A1    Mar. 26, 2015

Related U.S. Application Data

(63) Continuation of application No. 14/349,630, filed as application No. PCT/JP2012/072290 on Sep. 3, 2012, now Pat. No. 8,933,400.

(30) Foreign Application Priority Data

Oct. 5, 2011   (JP) .................................. 2011-220606

(51) Int. Cl.
*H01J 37/00* (2006.01)
*H01J 37/18* (2006.01)
(Continued)

(52) U.S. Cl.
CPC ................. *H01J 37/18* (2013.01); *H01J 37/16* (2013.01); *H01J 37/20* (2013.01); *H01J 37/22* (2013.01);
(Continued)

(58) Field of Classification Search
CPC ....................... G01R 31/305; H01J 2237/2817
USPC .............. 250/310, 304, 307, 311, 397, 492.2, 250/492.3
See application file for complete search history.

(56) References Cited

U.S. PATENT DOCUMENTS 6,172,363 B1 *   1/2001   Shinada et al. ................... 850/9
6,329,826 B1    12/2001   Shinada et al.
(Continued)

FOREIGN PATENT DOCUMENTS

CN        1662839 A     8/2005
JP     2000-228166 A     8/2000
(Continued)

OTHER PUBLICATIONS

Notice of Allowance U.S. Appl. No. 14/349,630 dated Sep. 16, 2014.
(Continued)

*Primary Examiner* — Michael Maskell
(74) *Attorney, Agent, or Firm* — McDermott Will & Emery LLP

(57) ABSTRACT

A sample observation method uses a charged particle beam apparatus comprising a charged particle optical column irradiating a charged particle beam, a vacuum chamber, and a sample chamber being capable of storing a sample. The method includes maintaining a pressure of the sample chamber higher than that of the vacuum chamber by a thin film which permits the charged particle beam to be transmitted, determining a relation between a height of a lower surface of the thin film and a height of a lower end of a lens barrel of an optical microscope, measuring a distance between the sample and the lens barrel, and setting a distance between the sample and thin film based on the relation and the distance.

3 Claims, 10 Drawing Sheets

(51) Int. Cl.
  *H01J 37/16* (2006.01)
  *H01J 37/22* (2006.01)
  *H01J 37/28* (2006.01)
  *H01J 37/20* (2006.01)
  *H01J 37/26* (2006.01)

(52) U.S. Cl.
  CPC ............. *H01J 37/226* (2013.01); *H01J 37/261* (2013.01); *H01J 37/28* (2013.01); *H01J 2237/166* (2013.01); *H01J 2237/182* (2013.01); *H01J 2237/204* (2013.01); *H01J 2237/2007* (2013.01); *H01J 2237/2602* (2013.01); *H01J 2237/2608* (2013.01)

(56) References Cited

U.S. PATENT DOCUMENTS

| | | | |
|---|---|---|---|
| 6,563,570 | B1* | 5/2003 | Okada ............... 356/35.5 |
| 6,891,170 | B1 | 5/2005 | Yu et al. |
| 7,417,444 | B2 | 8/2008 | Shinada et al. |
| 8,933,400 | B2* | 1/2015 | Ominami et al. ........ 250/306 |
| 2001/0008272 | A1* | 7/2001 | Rinn ............... 250/491.1 |
| 2002/0027440 | A1 | 3/2002 | Shinada et al. |
| 2005/0029467 | A1 | 2/2005 | Yu et al. |
| 2005/0218325 | A1 | 10/2005 | Nishiyama et al. |
| 2006/0249677 | A1 | 11/2006 | Chao et al. |
| 2010/0096549 | A1 | 4/2010 | Nishiyama |
| 2010/0140470 | A1 | 6/2010 | Shachal |
| 2014/0151553 | A1* | 6/2014 | Ominami et al. ........ 250/307 |

FOREIGN PATENT DOCUMENTS

| | | |
|---|---|---|
| JP | 2001-241940 A | 9/2001 |
| JP | 2005-026530 A | 1/2005 |
| JP | 2006-147430 A | 6/2006 |
| JP | 2008-153086 A | 7/2008 |
| JP | 2010-509709 A | 3/2010 |
| JP | 2010-080144 A | 4/2010 |

OTHER PUBLICATIONS

International Search Report w/English translation thereof, issued in International Application No. PCT/JP2012/072290 dated Oct. 23, 2012.
Partial Translation Office Action Korean Patent Application No. 10-2014-7008793 dated Apr. 7, 2015.
Partial Translation Office Action Korean Patent Application No. 10-2014-7034116 dated Apr. 7, 2015.
First Notiication of Examination Opinion Chinese Patent Application No. 201280048835.3 dated Aug. 25, 2015 with English translation.

* cited by examiner

INSPECTION OR OBSERVATION APPARATUS AND SAMPLE INSPECTION OR OBSERVATION METHOD

CROSS-REFERENCE TO RELATED APPLICATIONS

This application is a Continuation application of U.S. Ser. No. 14/349,630 filed Apr. 3, 2014, which is the is the U.S. National Phase of PCT/JP2012/072290 filed Sep. 3, 2012, which claims priority to Japanese Patent Application No. 2011-220606 filed Oct. 5, 2011. The subject matter of each is incorporated herein by reference in entirety.

TECHNICAL FIELD

The present invention relates to a technology which enables inspection or observation by a charged-particle technique and an optical technique. The invention includes a technology for observing a sample at an atmospheric pressure or in a predetermined gas atmosphere by use of a charged-particle microscope and an optical microscope.

BACKGROUND ART

For observation of a microscopic region of an object, scanning electron microscopes (SEMs) and transmission electron microscopes (TEMs) and the like are used. Generally, in these apparatuses, a second casing in which to dispose a sample is evacuated to establish a vacuum state as an atmosphere for the sample, before imaging. On the other hand, there has been a great need to observe samples such as biochemical samples and liquid samples with the use of both an optical microscope and an electron microscope in an atmospheric pressure, and not in a vacuum where those samples will be deteriorated or state-changed. In recent years, SEM apparatuses have been developed to observe an objective sample under an atmospheric pressure.

These apparatuses, in principle, have a configuration wherein a diaphragm permitting transmission of an electron beam therethrough is provided between an electrooptic system and a sample to partition part of a vacuum state and part of an atmospheric air state from each other. Thus, all these apparatuses have a common feature that a thin film is provided between a sample and an electrooptic system.

Patent Document 1 describes an atmospheric-pressure SEM having a configuration wherein an electron optical column is disposed with its electron source side directed downward and with its objective lens side directed upward, and a thin film transmissive to an electron beam is provided on the side of an electron beam emission hole at the terminal end of the electron optical column. In the invention described in Patent Document 1, the objective sample to be observed is mounted directly on the thin film, the sample is irradiated with a primary electron beam from below, and reflected electrons or secondary electrons are detected, thereby performing SEM observation. The sample is disposed inside an annular member (which is placed in the periphery of the thin film) but in a thin film-formed liquid. Thus, the document describes an atmospheric-pressure SEM suitable for use to observe a sample in a liquid, particularly. In addition, it is described that the optical microscope and the electron microscope are so disposed that their optical axes are coaxial, whereby both optical microscope observation and electron microscope observation can be performed.

In addition, Patent Document 2 describes an apparatus configuration wherein an optical microscope and an electron microscope equipped with a diaphragm are aligned, whereby a sample placed under an atmospheric pressure is observed alternately by the optical microscope and an electron microscope.

PRIOR ART DOCUMENTS

Patent Document

Patent Document 1: JP-2008-153086-A (U.S. Published Patent Application No. 2010/0096549)
Patent Document 2: JP-2001-241940-A (U.S. Published Patent Application No. 2001/0008272)

SUMMARY OF THE INVENTION

Problem to be Solved by the Invention

All of conventional charged-particle microscopes or charged-particle beam apparatuses provided with a function for observation under atmospheric pressure are apparatuses produced for exclusive use to perform observation under atmospheric pressure. There has not been any apparatus that enables easy observation under atmospheric pressure or in a gas atmosphere by use of an ordinary high-vacuum charged-particle microscope.

For instance, the atmospheric-pressure SEM described in Patent Document 1 is a structurally very special apparatus, with which it is impossible to carry out ordinary SEM observation in a high vacuum atmosphere. Besides, since the optical microscope and the electron microscope are disposed opposite to each other, the samples which can be observed from both sides thereof by the optical microscope and the electron microscope are restricted to transparent samples such as liquid samples. Thus, the atmospheric-pressure SEM described in the document has problems as to usability.

For example, with the atmospheric-pressure SEM under consideration, it is impossible to observe the same part of a semiconductor microscopic pattern formed on a silicon substrate or the like by both the optical microscope and the electron microscope. In addition, even when the same sample is observed, the direction of observation by the optical microscope and that by the electron microscope are utterly opposite to each other. Therefore, a complicated processing would be required when collating the observation results obtained respectively by the two types of microscopes.

The apparatus described in Patent Document 2 is also a structurally very special apparatus, with which it is impossible to observe a sample under an electron microscope while placing the sample in vacuum in an ordinary manner. Especially, since the apparatus has the electron beam lens exposed to the atmospheric air, it is difficult to achieve appropriate observation of the sample by use of an electron beam. Thus, the apparatus is applicable to limited use, and therefore has problems as to usability.

The present invention has been made in consideration of such problems as mentioned above. Accordingly, it is an object of the present invention to provide an inspection apparatus, an observation apparatus, an inspection method or an observation method by which appropriate inspection or observation of a sample can be performed in an easy-to-use manner, using a charged-particle technique and an optical technique.

Means for Solving the Problem

According to one mode of the present invention, there is provided an inspection or observation apparatus including: a charged-particle irradiation section for radiating a primary charged-particle beam; a first casing forming at least part of a first space capable of being maintained in a vacuum state, the first space constituting at least part of a region through which the primary charged-particle beam emitted from the charged-particle irradiation section reaches a sample; a second casing forming at least part of a second space capable of storing the sample therein, the second casing provided on the first casing; an evacuation device for evacuating the first space; a detector for detecting a charged-particle beam irradiated from the charged-particle irradiation section; a partition wall section partitioning the first space and the second space from each other, the partition wall section disposed so as to be coaxial with the charged-particle irradiation section when the sample is irradiated with the primary charged-particle beam radiated from the charged-particle irradiation section; an optical observation section for casting light onto the sample and detecting light from the sample from the same direction as the charged-particle irradiation section; and a sample mount section for mounting the sample.

According to another mode of the present invention, there is provided a sample inspection or observation method including: casting light onto a sample mounted on a sample mount section and detecting light from the sample by an optical observation section; moving the sample mounted on the sample mount section to a position where the sample can be irradiated with a primary charged-particle beam emitted from a charged-particle irradiation section; irradiating the sample mounted on the sample mount section with the primary charged-particle beam emitted from the charged-particle irradiation section from the same direction as the optical observation section with reference to the sample, the primary charged-particle beam passing through a first space which can be maintained in a vacuum state, and through a partition wall section disposed coaxially with the charged-particle irradiation section to partition the first space and the second space from each other; and detecting a charged-particle beam from the sample by a detection section.

Effects of the Invention

According to the present invention, it is possible to provide an inspection apparatus, an observation apparatus, an inspection method or an observation method by which appropriate inspection or observation of samples can be performed in an easy-to-use manner, using a charged-particle technique and an optical technique.

MODES FOR CARRYING OUT THE INVENTION

Figure 1:
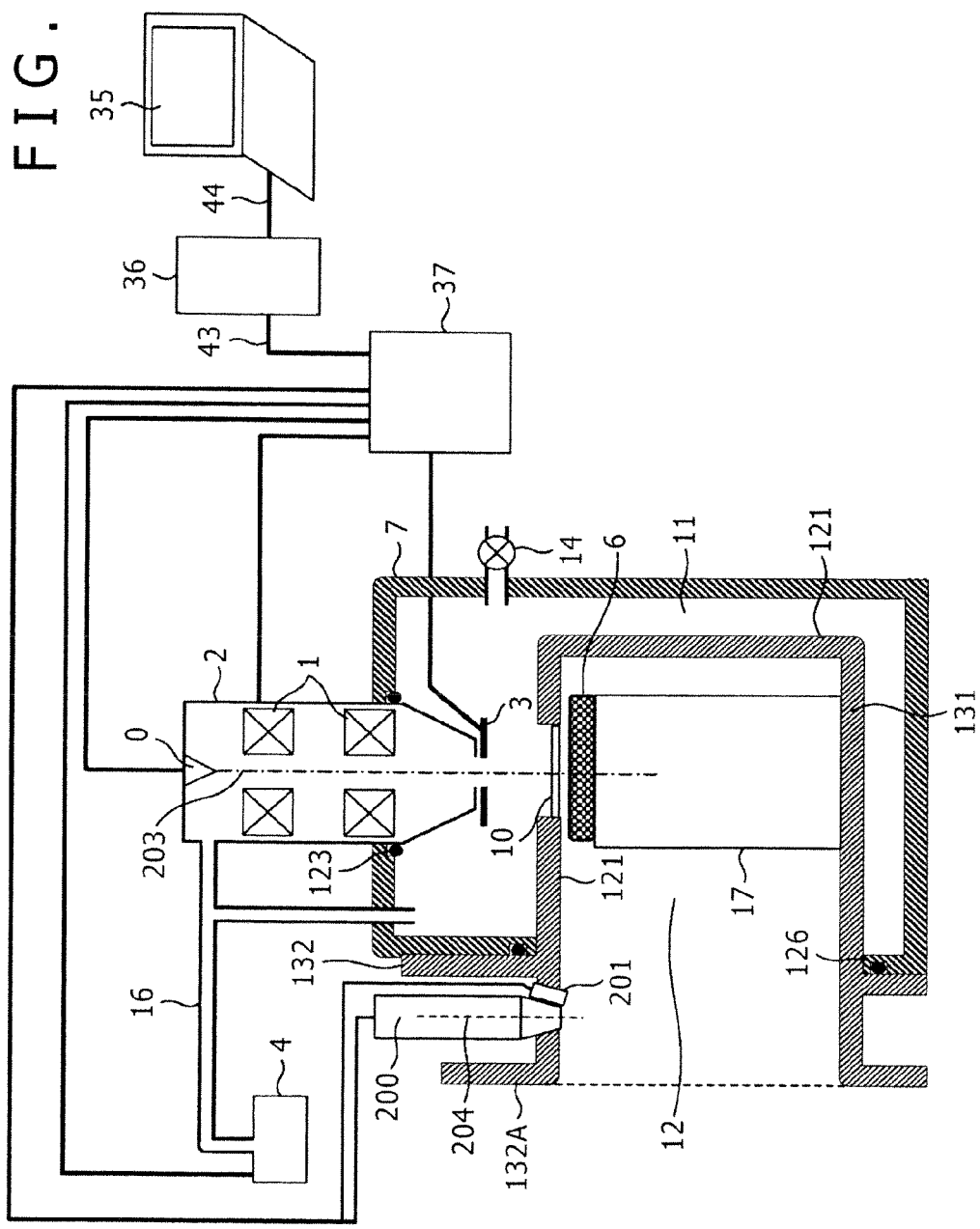
FIG. 1 is a general schematic diagram of an observation apparatus as a charged-particle microscope equipped with an optical microscope in a first embodiment.

Now, embodiments of the present invention will be described below, referring to the drawings.

Incidentally, as a mode of the present invention, an attachment capable of storing a sample therein while maintaining the pressure in the inside thereof at a pressure higher than the pressure in a vacuum chamber provided for a charged-particle microscope is inserted into the vacuum chamber through an aperture section and mounted in the vacuum chamber, whereby the easiness to use is enhanced. The aperture section of the vacuum chamber is provided, for example, at a side surface of the vacuum chamber. In addition, the attachment has the function of holding a thin film which permits a primary charged-particle beam to be transmitted or to pass therethrough into the inside of the attachment, whereby a pressure difference can be secured between the inside of the vacuum chamber and the inside of the attachment. Furthermore, an optical microscope using light as a light source and detecting light is mounted to the vacuum chamber or the attachment, whereby observation with the charged-particle microscope and observation with the optical microscope can be carried out.

Here, the attachment is used by being inserted through the aperture section of the vacuum chamber into the inside of a casing. In the following description, the vacuum chamber will sometimes be referred to as a first casing, and the attachment as a second casing in relation to the vacuum chamber.

First Embodiment

As a first embodiment, a most basic embodiment will be described. FIG. 1 shows a general schematic diagram of an observation apparatus (inspection apparatus) as a charged-particle microscope equipped with an optical microscope according to this embodiment. The charged-particle microscope shown in FIG. 1 mainly includes: a charged-particle optical column 2 as a charged-particle irradiation section for radiating a primary charged-particle beam; a first casing (vacuum chamber) 7 for supporting the charged-particle optical column 2 in relation to an apparatus installation surface; a second casing (attachment) 121 used in the state of being inserted in the first casing 7; an optical microscope; and a control system for controlling these components. The first casing 7 forms at least part of a first space constituting at least part of a region through which the primary charged-particle beam radiated from the charged-particle optical column 2 reaches a sample, the first space being able to be maintained in a vacuum state. Besides, the second casing 121 is provided on the first casing 7, and forms at least part of a second space in which the sample can be stored.

At the time of using the charged-particle microscope, the inside of the charged-particle optical column 2 and the inside of the first casing are evacuated by a vacuum pump 4. Starting and stopping operations of the vacuum pump 4 are also controlled by the control system. While only one vacuum pump 4 is shown in the drawing, two or more vacuum pumps may be provided.

The charged-particle optical column 2 includes such elements as a charged-particle source 0 which generates a charged-particle beam, and optical lenses 1 by which the charged-particle beam thus generated is condensed and guided to a lower portion of the optical column and is scanned across the sample 6 as a primary charged-particle beam. The charged-particle optical column 2 is so disposed as to project into the inside of the first casing 7, and is fixed to the first casing 7 through a vacuum seal member 123. At an end portion of the charged-particle optical column 2, a detector 3 is disposed which detects secondary charged particles (secondary electrons or reflected electrons) obtained by irradiation with the primary charged-particle beam. The detector 3 as a detection section is preferably provided in the inside of the first casing 7, as shown in FIG. 1. This ensures that the secondary charged particles (secondary electrons or reflected electrons) obtained by irradiation with the primary charged-particle beam can be detected in vacuum, which enables more accurate detection. In addition, the detector 3 may be preferably provided in the charged-particle optical column 2, or depending on the circumstances, in the second casing 121.

The charged-particle microscope in the present embodiment is provided, as a control system, with a personal computer 35 used by the apparatus user, an upper-level control section 36 connected to the personal computer 35 and used for transmission, and a lower-level control section 37 which controls an evacuation system, the charged-particle optical system and the like according to commands transmitted from the upper-level control section 36. The personal computer 35 includes a monitor on which an operation screen (GUI) for the apparatus is displayed, and means for inputting into the operation screen, such as a keyboard or a mouse. The upper-level control section 36, the lower-level control section 37 and the personal computer 35 are connected communication lines 43, 44.

The lower-level control section 37 is a section for transmission and reception of control signals for controlling the vacuum pump 4, a charged-particle source 0, optical lenses 1, a light source 201, a lens-barrel 200, etc. Furthermore, the lower-level control section 37 converts an output signal from the detector 3 into a digital image signal, and transmits the digital image signal to the upper-level control section 36. While the output signal from the detector 3 is connected to the lower-level control section 37 in the drawing, an amplifier such as a preamplifier may be interposed between the detector 3 and the lower-level control section 37.

In the upper-level control section 36 and the lower-level control section 37, an analog circuit and a digital circuit and the like may be present in a mixed manner, or, the upper-level control section 36 and the lower-level control section 37 may be unified into a single system. Incidentally, the configuration of the control system shown in FIG. 1 is merely one example. Modifications of a control unit, valves, the vacuum pump, communication lines, etc. belong to the SEM or charged-particle beam apparatus according to this embodiment insofar as they satisfy the functions intended in this embodiment.

A vacuum piping 16 connected at its one end to the vacuum pump 4 is connected to the first casing 7, so that the inside of the first casing 7 can be maintained in a vacuum state. Simultaneously, the first casing 7 is provided with a leak valve 14 for opening the inside of the casing to the atmospheric air, whereby the inside of the first casing 7 can be opened to the atmospheric air at the time of maintenance or in other similar situations. The leak valve 14 may be absent, or, on the contrary, two or more leak valves may be provided. The location where the leak valve 14 is disposed on the first casing 7 is not restricted to the one shown in FIG. 1, and may be other position on the first casing 7. Furthermore, the first casing 7 is provided with an aperture section at a side surface thereof. The second casing 121 is inserted into the first casing 7 through this aperture section.

The second casing 121 includes a rectangular parallelepiped main body section 131, a mating section 132, and a holding section 132A. The main body section 131 has the function of storing therein a sample 6 as an object to be observed, and is inserted into the inside of the first casing 7 through the aperture section. The mating section 132 forms a mating surface for an outer wall surface on the side of the side surface, where the aperture section is provided, of the first casing 7. The mating section 132 is fixed to the outer wall surface on the side of the side surface through a vacuum seal member 126. The holding section 132A is configured to hold the optical microscope (the lens-barrel 200, etc.).

This ensures that the whole part of the second casing 121 is fitted into the first casing 7. Most simply or easily, the aperture section is produced by utilizing a sample carrying-in/carrying-out aperture originally provided in a vacuum sample chamber of the charged-particle microscope. Specifically, when the second casing 121 is produced in accordance with the size of an originally existing hole and a vacuum seal member 126 is attached to the periphery of the hole, alteration of apparatus required to obtain the just-mentioned configuration can be minimized. In other words, the apparatus alteration can be made without largely modifying the configuration of a conventional high vacuum type charged-particle microscope.

On the side of an upper surface of the main body section 131, a thin film 10 is provided at a position which is located beneath the charged-particle optical column 2 when the whole body of the second casing 121 is fitted in the first casing 7. The thin film 10 is so configured that the primary charged-particle beam emitted from the lower end of the charged-particle optical column 2 can be transmitted through or can pass through the thin film 10. Thus, the primary charged-particle beam passes through the thin film 10, to finally reach the sample 6. In the case where the charged-particle beam is an electron beam, the thickness of the thin film 10 may be preferably on such a level that the electron beam can be transmitted through the thin film 10; typically, the thickness may be not more than about 20 μm. An aperture member provided with a primary charged-particle beam passing hole may be used in place of the thin film. As for the bore diameter in that case, the hole desirably has an area of not more than about 1 mm$^2$, in view of the need for differential evacuation with an actual vacuum pump. In the case where the charged-particle beam is an ion beam, an aperture with a hole area of not more than about 1 mm$^2$ is used, since it is difficult to permit the ion beam to penetrate a thin film without damaging the thin film.

The one-dot chain line in the drawing indicates an optical axis 203 of the primary charged-particle beam. The charged-particle optical column 2 and the first casing 7 and the thin film 10 are disposed coaxially with the optical axis of the primary charged-particle beam. The spacing between the sample 6 and the thin film 10 is adjusted by a sample table 17 having an appropriate height. The sample table 17 is configured as a sample mount section on which to mount the sample.

The optical microscope is held by a holding section 132A of the second casing 121. The optical microscope includes at least a light source 201 for emitting light, and the optical microscope lens-barrel 200. The lens-barrel 200 includes at least an optical lens or lenses, and an image detection section for detecting an image. The optical microscope is so configured as to convert an image into a signal, such as a digital signal, and to perform data transfer through the communication line 43. The lens-barrel 200 as an optical observation section is configured to detect light from the sample 6 from the same direction as the charged-particle optical column 2.

Incidentally, the optical detection section such as the optical microscope may be configured by use of a detection device such as a CCD device for direct conversion of light into a digital signal, or may be configured by use of an ocular or the like permitting direct visual observation.

The spacing between the optical axis 204 of the lens-barrel 200 and the optical axis 203 of the electron microscope is set at a predetermined spacing as a previously known spacing.

By a process in which the sample table 17 is moved by a distance equivalent to the predetermined spacing after observation of a sample under the optical microscope, the same part of the sample can be observed by the optical microscope and the electron microscope. In addition, the same part can be observed under the optical microscope and the electron microscope from the same direction, as contrasted to the case of a configuration in which an optical microscope and an electron microscope are disposed opposite to each other, as described in the cited Document 1. As a result, usability can be enhanced.

As shown in FIG. 1, a side surface of the second casing 121 is open, so that the sample 6 stored in the inside of the second casing 121 (the right side of the broken line in the figure; this space will hereinafter referred to as second space 12) is placed in an atmospheric-pressure state during observation. On the other hand, the vacuum pump 4 is connected to the first casing 7, and a closed space (hereinafter referred to as first space 11) defined by inner wall surfaces of the first casing 7 and outer wall surfaces of the second casing 121 and the thin film 10 can be evacuated. Therefore, in this apparatus, electron beam lenses are not exposed to the atmosphere, unlike in the apparatus described in Patent Document 2. Accordingly, during operation of the apparatus, the charged-particle optical column 2 and the detector 3 can be maintained in a vacuum state, whereas the sample 6 can be maintained under the atmospheric pressure, so that appropriate observation is enabled. In addition, light is cast onto the sample 6 mounted on the sample table 17, and light from the sample 6 is detected by the lens-barrel 200. Then, the sample 6 mounted on the sample table 17 is moved to a position where the sample 6 can be irradiated with the primary charged-particle beam emitted from the charged-particle optical column 2. Thus, the sample 6 mounted on the sample table 17 can be irradiated with the primary charged-particle beam radiated from the charged-particle optical column 2 and the primary charged-particle beam from the sample 6 can be detected by the detector 3, from the same direction as the lens-barrel 200. In this case, the primary charged-particle beam passes through the first space 11 capable of being maintained in a vacuum state, and through the thin film 10 disposed coaxially with the charged-particle optical column 2 to partition the first space 11 and the second space 12 from each other. Consequently, a sample inspection or sample observation method is realized.

Furthermore, since the second casing 121 has an open side, the sample 6 can be freely replaced during observation under the optical microscope or the electron microscope.

In addition, it is possible to realize an inspection apparatus or observation apparatus enabling inspection or observation at an atmospheric pressure even when the sample is a comparatively large sized sample.

Incidentally, it is preferable that the optical axis 204 of the lens-barrel 200 of the optical microscope and the optical axis 203 of the charged-particle optical column 2 are set parallel to each other. This enhances the advantage that the same part of the sample can be observed under the two types of microscopes from the same direction. The optical axis 204 of the lens-barrel 200 and the optical axis 203 of the electron microscope may be disposed obliquely to each other, insofar as the same part of the sample is permissible to be observed under the two types of microscopes from generally the same direction. Incidentally, the expression "the lens-barrel 200 of the optical microscope which detects light from the sample 6 from the same direction as the charged-particle optical column 2" used herein includes any system that has a charged-particle optical column 2 and a lens-barrel 200 disposed above a sample 6, unlike the configuration wherein an optical microscope and an electron microscope are disposed opposite to each other as described in the cited Document 1.

In addition, the thin film 10 functions as a partition wall section which partitions the first space 11 and the second space 12 from each other and which is so disposed as to be coaxial with the charged-particle optical column 2 when the sample 6 is irradiated with the primary charged-particle beam radiated from the charged-particle optical column 2.

Second Embodiment

Figure 2:
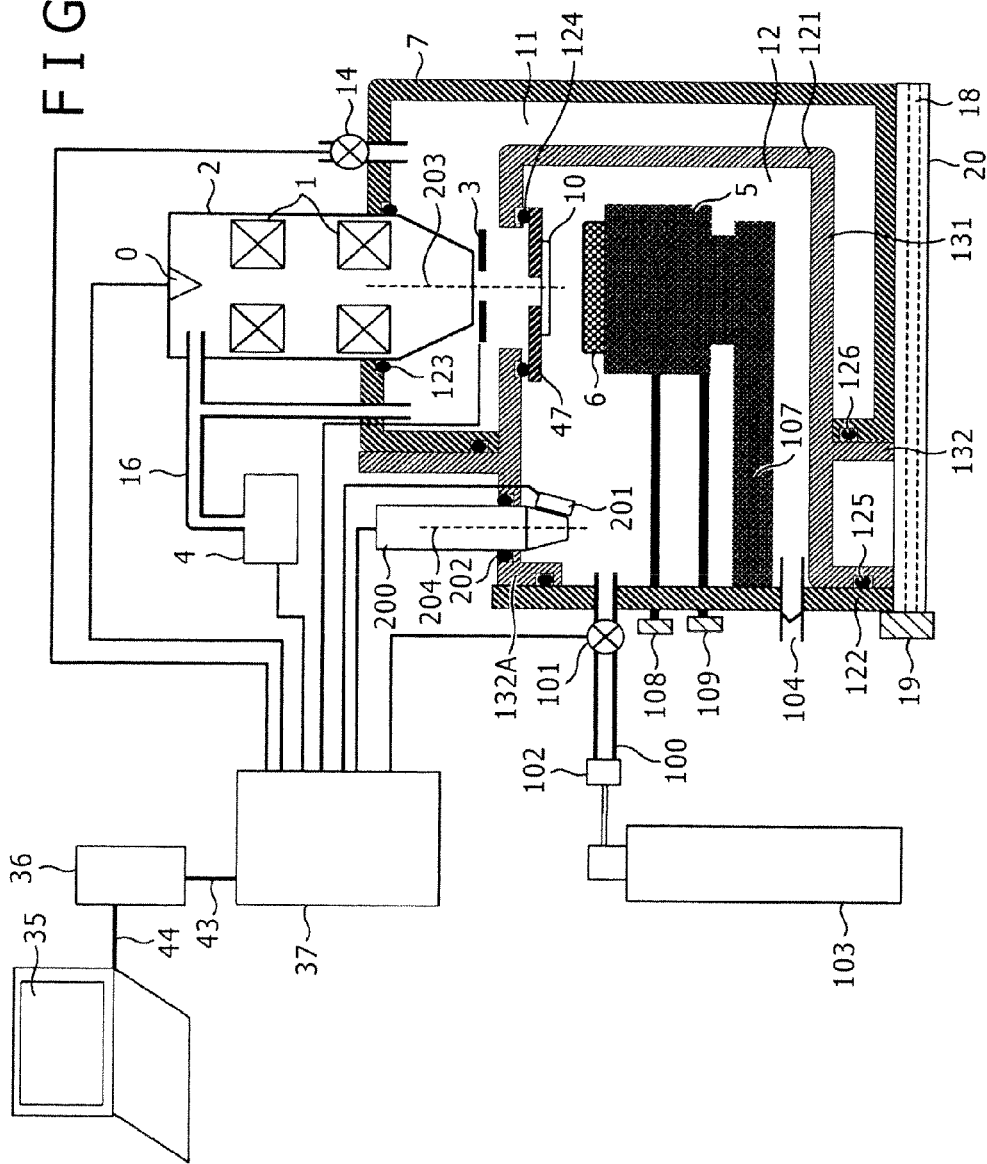
FIG. 2 is a general schematic diagram of an observation apparatus as a charged-particle microscope equipped with an optical microscope in a second embodiment.

A second embodiment will be described. FIG. 2 shows a general schematic diagram of an observation apparatus (inspection apparatus) as a charged-particle microscope equipped with an optical microscope in the second embodiment. The second embodiment differs from the first embodiment generally in that a thin film holding member 47 is provided, that a second casing 121 is so configured as to permit an air atmosphere at 1 atm, a gas atmosphere or a vacuum atmosphere to be established in the inside thereof, and that a sample stage 5 as a sample mount section is equipped with a driving system. In the following description, descriptions of the same parts as those in the first embodiment will be omitted as far as possible.

In this embodiment, a thin film 10 is detachably fixed to an upper surface of a main body section 131 of a second casing 121 through the thin film holding member 47, unlike in the first embodiment. The thin film 10 is secured to the thin film holding member 47 so as to provide vacuum seal. The securing may be conducted by use of a vacuum seal member 124 such as an O-ring, or may be performed by use of an organic material such as adhesive or by use of a tape or the like.

The thin film holding member 47 is detachably fixed to the lower surface side of a ceiling plate of the second casing 121 through a vacuum seal member. The thin film 10 is as very thin as not more than 20 µm, in view of the need for transmission of an electron beam therethrough. Therefore, the thin film 10 may deteriorate with the lapse of time or may be broken during preparation for observation. On the other hand, the thin film 10 is very difficult to handle directly. When the thin film 10 can be handled not directly but through the thin film holding member 47, as in this embodiment, very easy handling (particularly, replacement) is promised. Specifically, when the thin film 10 is broken, it suffices that the thin film holding member 47 with the thin film 10 held thereon is replaced as a whole. Even if the thin film 10 should have to be replaced directly, it would be possible to take out the thin film holding member 47 to the exterior of the apparatus, and to replace the thin film in the outside of the apparatus. Incidentally, an aperture member having a hole with an area of not more than about 1 mm² may be used in place of the thin film, like in the first embodiment.

An open side of the second casing 121 can be covered with a cover member 122, whereby various functions can be realized. This point will be described below.

In the observation apparatus according to this embodiment, a function of supplying a replacement gas into the second casing 121 is provided. An electron beam emitted from the lower end of the charged-particle optical column 2 passes through a first space 11 maintained under a high vacuum, then passes through the thin film 10 (or the aperture member) shown in FIG. 2, and, further, goes into a second space 12 maintained under an atmospheric pressure or a low vacuum degree (lower than the vacuum degree in the first space). In a space at a low vacuum degree, however, the electron beam is scattered by gas molecules, and, therefore, the mean free path is short. In other words, when the distance between the thin film 10 and the sample 6 is large, the electron beam or the secondary electrons or reflected electrons generated by irradiation with the electron beam would be unable to reach the sample. On the other hand, the probability of scattering of the electron beam is proportional to the mass number of the gas molecules. Therefore, when the atmosphere inside the second space 12 is replaced with gas molecules lower in mass number than the atmospheric air, the probability of scattering of the electron beam is lowered, to enable the electron beam to reach the sample. As the replacement gas in this case, gases lighter than the atmospheric air, such as nitrogen or water vapor, may be used, whereby an improving effect on image S/N is ensured. However, helium gas and hydrogen gas which are further lower in mass promise a higher improving effect on image S/N.

The lens-barrel 200 of the optical microscope is so configured that its upper portion is disposed in the atmospheric-air space outside of the apparatus, while its lower portion, or at least an objective lens, is disposed in the second space 12. The lens-barrel 200 is secured to the second casing 121 so as to provide vacuum seal. The securing may be performed by use of a vacuum seal member 124 such as an O-ring, or may be conducted by use of an organic material such as adhesive or by use of a tape or the like. A light source 201 of the lens-barrel 200 of the optical microscope is disposed in the second space 12.

In general optical microscopes, observation at a higher magnification can be realized as the distance between the objective lens and the sample is shorter. In this embodiment, the light source 201 of the optical microscope and the objective lens as a detection section of the lens-barrel 200 are so disposed as to be located inside the second space 12. This enables observation of the sample 6 at a closer position.

For the foregoing reason, in the observation apparatus in this embodiment, the cover member 122 is provided with a mounting section (gas introduction section) for a gas supply pipe 100. The gas supply pipe 100 is connected to a gas cylinder 103 by a connection section 102, whereby the replacement gas is introduced into the second space 12. The gas supply pipe 100 is equipped at its intermediate portion with a gas control valve 101, whereby the flow rate of the replacement gas flowing in the pipe can be controlled. A signal wiring extends from the gas control valve 101 to a lower-level control section 37. The user of the apparatus can control the flow rate of the replacement gas by an operation on an operation screen displayed on a monitor of a personal computer 35.

The replacement gas, which is a light-element gas, is liable to collect in an upper portion of the second space 12. Therefore, it is difficult to replace the atmosphere on the lower side in the second space 12 with the replacement gas. In view of this, it is preferable to provide a cover member 122 with an opening on the lower side of the mounting position of the gas supply pipe 100 (in FIG. 2, the opening is provided at a mounting position of a pressure regulation valve 104). This ensures that the atmospheric-air gas is pushed by the light-element gas introduced from the gas introduction section, and is discharged through the opening provided on the lower side. Consequently, the atmosphere inside the second casing 121 can be replaced efficiently. Incidentally, this opening may be designed to function also as a rough evacuation port, which will be described later.

The second casing 121 or the cover member 122 may be provided with an evacuation port. By connecting a vacuum pump to this evacuation port, it is also possible to set the second space 12 in a vacuum state. This enables electron microscope observation in an extremely low vacuum state, for example, at 0.1 atm, which cannot be implemented with an ordinary SEM.

In addition, preferably, a replacement gas may be introduced into the second casing 121 after once evacuating the inside of the second casing 121 through the evacuation port. The evacuation in this case is required only to reduce the amount of the atmospheric-air gas components remaining inside the second casing 121 to or below a predetermined amount. Therefore, it is unnecessary to perform evacuation to attain a high degree of vacuum, and rough evacuation suffices. It should be noted, however, that in the case of observation of a water-containing sample such as a bio-sample, the sample once placed in a vacuum state will show a change in state due to evaporation of water. In such a case, therefore, it is preferable to introduce the replacement gas, starting directly from the air atmosphere, as above-mentioned. The opening is closed with the cover member after the introduction of the replacement gas, whereby the replacement gas can be effectively confined inside the second space 12.

With a three-way valve attached at the position of the opening, the opening can be used as both a rough evacuation port and an air leak exhaust port, in a combined manner. Specifically, when one way of the three-way valve is attached to the cover member 122, another way is connected to a rough evacuation pump and the remaining one way is connected to a leak valve, the just-mentioned combined evacuation/exhaust port can be implemented.

A pressure regulation valve 104 may be provided in place of the above-mentioned opening. The pressure regulation valve 104 has a function of automatically opening when the pressure inside the second casing 121 reaches or exceeds 1 atm. By providing a pressure regulation valve having such a function, it is ensured that when the inside pressure reaches or exceeds 1 atm at the time of introducing a light-element gas, the pressure regulation valve 104 automatically opens to exhaust the atmospheric-air components such as nitrogen and oxygen to the outside of the apparatus, whereby the inside of the apparatus can be filled up with the light-element gas. Incidentally, the gas cylinder 103 may be provided as part of the observation apparatus in some cases, and may be mounted by the user of the apparatus after installation of the apparatus in some other cases.

Now, a method of adjusting the position of the sample 6 will be described below. The observation apparatus according to this embodiment is provided with a sample stage 5 as position adjusting means relating to an observation visual field. The sample stage 5 is equipped with an XY driving mechanism for driving in an XY plane and a Z-axis driving mechanism for driving in the height direction. A support plate 107 serving as a bottom plate for supporting the sample stage 5 is mounted to the cover member 122, and the sample stage 5 is fixed to the support plate 107. The support plate 107 is mounted to that surface of the cover member 122 which faces the second casing 121, in such a manner as to extend toward the inside of the second casing 121. Support shafts extend respectively from the Z-axis driving mechanism and the XY driving mechanism, and are connected to a control knob 108 and a control knob 109 respectively. The user of the apparatus operates the control knob 108 and the control knob 109, thereby adjusting the position of the sample 6 inside the second casing 121.

In adjusting the sample position, ordinarily, the position in the plane (horizontal plane) is determined and then the position in the height direction is adjusted. For obviating breakage of the thin film 10, the position of the sample 6 in the height direction should be adjusted so that the sample 6 is not too close to the thin film 10. In view of this, the following procedure may be adopted in the observation apparatus according to this embodiment. The distance between the sample 6 and the lens-barrel 200 is preliminarily measured by the optical microscope (the light source 201 and the lens-barrel 200). Based on the relationship between the height of the lower surface of the thin film 10 and the height of the lower end of the lens-barrel 200 which relationship has preliminarily been determined, the distance between the sample 6 and the thin film 10 is set.

Now, description will be made of a moving mechanism by which the sample stage 5 can be moved between a position where observation of the sample 6 by the optical microscope is possible and a position where observation of the sample by the charged-particle microscope is possible. This moving mechanism is so configured as to at least ensure that the sample mount section can be moved between a first position where the sample 6 is irradiated with a primary charged-particle beam radiated from the charged-particle optical column 2 and a second position where light from the sample 6 is detected by the lens-barrel 200 of the optical microscope. Incidentally, this moving mechanism may be designed to also have a function for replacing the sample 6. The observation apparatus in this embodiment is provided with a cover member supporting member 19 and a bottom plate 20, at a bottom surface of the first casing 7 and at a lower end portion of the cover member 122, respectively.

The bottom plate 20 is provided with a support bar 18 used as a guide when the sample stage 5 is moved. In normal state, the support bar 18 is stored in a storage section provided in the bottom plate 20. At the time of moving the sample stage 5, the support bar 18 is extended in the direction in which the cover member 122 is drawn out. The support bar 18 and the storage section provided in the bottom plate 20 are configured to have at least such a length that the sample stage 5 can be moved between a position where the sample 6 can be observed under the optical microscope and a position where the sample 6 can be observed under the charged-particle microscope. By using this moving mechanism, the sample 6 can be observed under the charged-particle microscope after being observed under the optical microscope. Specifically, with the support bar 18 extended in the drawing-out direction of the cover member 122 or kept in the extended state, the sample stage 5 can be disposed at a position where the sample 6 can be observed under the optical microscope; to be more specific, an objective part to be observed of the sample 6 can be disposed on the optical axis 204 of the lens-barrel 200 of the optical microscope. In addition, with the support bar 18 stored into the storage section of the bottom plate 20 in the direction opposite to the drawing-out direction of the cover member 122 or kept in the stored state, the sample stage 5 can be disposed at a position where the sample 6 can be observed under the charged-particle microscope; to be more specific, the objective part to be observed of the sample 6 can be disposed on the optical axis 203 of the charged-particle optical column 2 of the charged-particle microscope.

Besides, the support bar 18 has a function of being used as a guide at the time of detaching the cover member 122. Specifically, the support bar 18 is configured to have a function of extending in the drawing-out direction of the cover member 122 when the cover member 122 is detached. Simultaneously, the support bar 18 is fixed to the cover member supporting member 19 so that when the cover member 122 is detached from the second casing 121, the cover member 122 and the main body of the observation apparatus are not completely separated. This ensures that falling of the sample stage 5 or the sample 6 can be prevented. The cover member 122 is detachably fixed to the second casing 121 through a vacuum seal member 125. On the other hand, the cover member supporting member 19 is also detachably fixed to the bottom plate 20. Therefore, the cover member 122 and the cover member supporting member 19 can be detached as one body from the second casing 121.

In the case where the sample 6 is observed under the charged-particle microscope after observed under the optical microscope, the sample stage 5 is first disposed at a position where the sample 6 can be observed under the optical microscope. In other words, the objective part to be observed of the sample 6 is disposed on the optical axis 204 of the lens-barrel 200 of the optical microscope. In this state, observation is conducted. Next, the cover member 122 is pushed into the second casing 121, to move the sample stage 5 so that the sample 6 is disposed roughly at a position where the sample 6 can be observed under the charged-particle microscope. The cover member 122 is fixed to the mating section 132 by a fastening member (not shown), after which a replacement gas is introduced. Subsequently, position adjustment is conducted by use of the position adjusting means. For instance, the sample 6 is brought closer to the thin film 10 by turning the Z-axis control knob for the sample stage 5. Then, the same objective part to be observed of the sample 6 as that having been observed under the optical microscope is observed under the charged-particle microscope. The above-mentioned operations can be carried out while an operation of the charged-particle optical column 2 is continued. Accordingly, the observation apparatus in this embodiment enables swift starting of observation.

In addition, in the case of carrying a sample into the second casing 2, first, the sample 6 is moved away from the thin film 6 by turning the Z-axis control knob for the sample stage 5. Next, the pressure regulation valve 104 is opened, thereby exposing the inside of the second casing 121 to the atmospheric air. Subsequently, it is confirmed that a reduced-pressure state or an extremely pressurized state is not existing inside the second casing 121, after which the cover member 122 is drawn out to the side opposite to the apparatus main body. As a result, a state in which the sample 6 can be replaced is established. After sample replacement, the cover member 122 is pushed into the second casing 121, and the cover member 122 is fixed to the mating section 132 by a fastening member (not shown), followed by introduction of the replacement gas. The foregoing operations can be carried out while an operation of the charged-particle optical column 2 is continued. Consequently, the observation apparatus in this embodiment enables rapid starting of observation after sample replacement.

In the present embodiment, the sample stage 5, the control knobs 108, 109 therefor, the gas supply pipe, and the pressure regulation valve 104 are all attached to the cover member 122 in a concentrated fashion. This permits the user of the apparatus to carry out operations of the control knobs 108, 109, an operation of moving the sample stage, an operation of replacing a sample, and operations of attaching and detaching the gas supply pipe 100 and the pressure regulation valve 104, on the same surface of the first casing. Accordingly, usability of the apparatus can be enhanced as compared with scanning electron microscopes in which the above-mentioned components are attached to different surfaces of a sample chamber in a separate or scattered manner.

Third Embodiment

Figure 3:
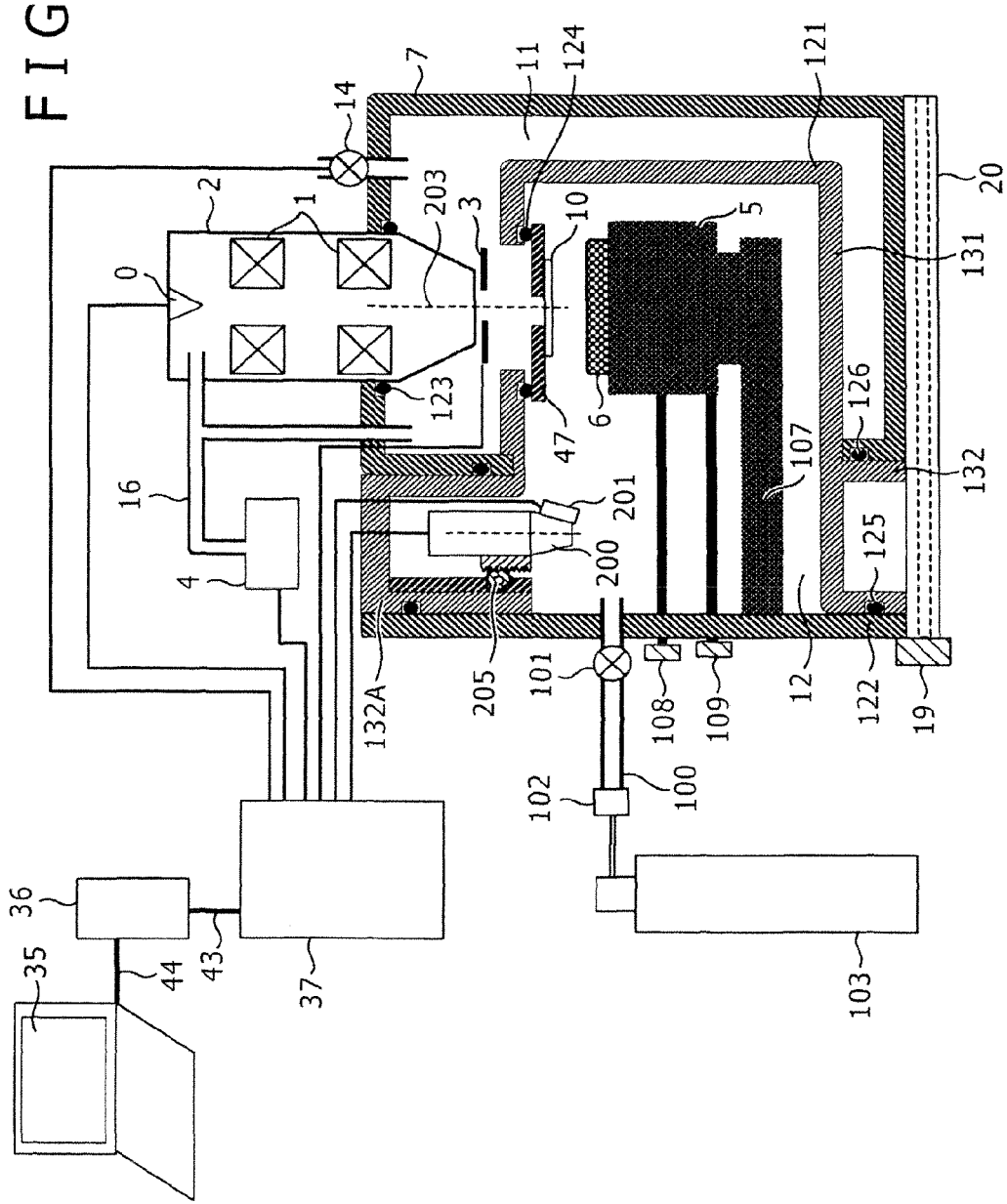
FIG. 3 is a general schematic diagram of an observation apparatus as a charged-particle microscope equipped with an optical microscope in a third embodiment.

A third embodiment will be described. FIG. 3 shows a general schematic diagram of an observation apparatus (inspection apparatus) as a charged-particle microscope equipped with an optical microscope in a third embodiment. The third embodiment differs from the second embodiment generally in that a lens-barrel 200 of an optical microscope is wholly contained in a second space, that a communication line 43 is drawn out to the exterior of the apparatus, and that the apparatus includes a driving mechanism 205 for changing the position of the optical microscope. In the following description, descriptions of the same parts as those in the second embodiment will be omitted as far as possible.

In this embodiment, the upper side of a holding section 132A of a second casing 121 is projected so that the height position of the upper surface of the holding section 132A and the height position of the upper surface of a first casing 7 substantially agree with each other. On an inside wall of the holding section 132A, there is provided the driving mechanism 205 for moving the optical microscope away from and toward a sample 6 (in the vertical direction). In a general optical microscope, focusing of an image can be achieved by controlling the distance between an optical lens, such as an objective lens, and a sample. The whole part of the optical microscope is moved away from and toward the sample 6 by the driving mechanism 205, whereby focusing can be achieved without changing the height position of the sample 6. This embodiment is particularly preferable in the case where an image detection section provided on the optical microscope to detect the image is a CCD device.

Incidentally, the driving mechanism 205 may be so configured that a light source 201 and a lens-barrel 200 of the microscope can be moved, or that only the light source 201 and the optical lens such as an objective lens of the lens-barrel 200 can be moved. Alternatively, the driving mechanism 205 may be so configured that only the lens-barrel 200 can be moved without moving the light source 201, or that only the optical lens such as the objective lens of the lens-barrel 200 can be moved without moving the light source 201. Thus, it is preferable that part or the whole body of the microscope is moved away from and toward the sample 6.

The spacing between the optical axis 204 of the lens-barrel 200 and the optical axis 203 of an electron microscope is set at a predetermined distance as a preliminarily known distance.

After observation of a sample under the optical microscope, a sample table 17 is moved by an amount equivalent to the predetermined distance, whereby the same part of the sample can be observed under the optical microscope and under the electron microscope. In addition, the same part of a sample can be observed under the two types of microscopes from the generally same direction, unlike in a configuration wherein an optical microscope and an electron microscope are disposed opposite to each other as described in the cited Document 1. Thus, usability of the apparatus can be enhanced.

Fourth Embodiment

Figure 4:
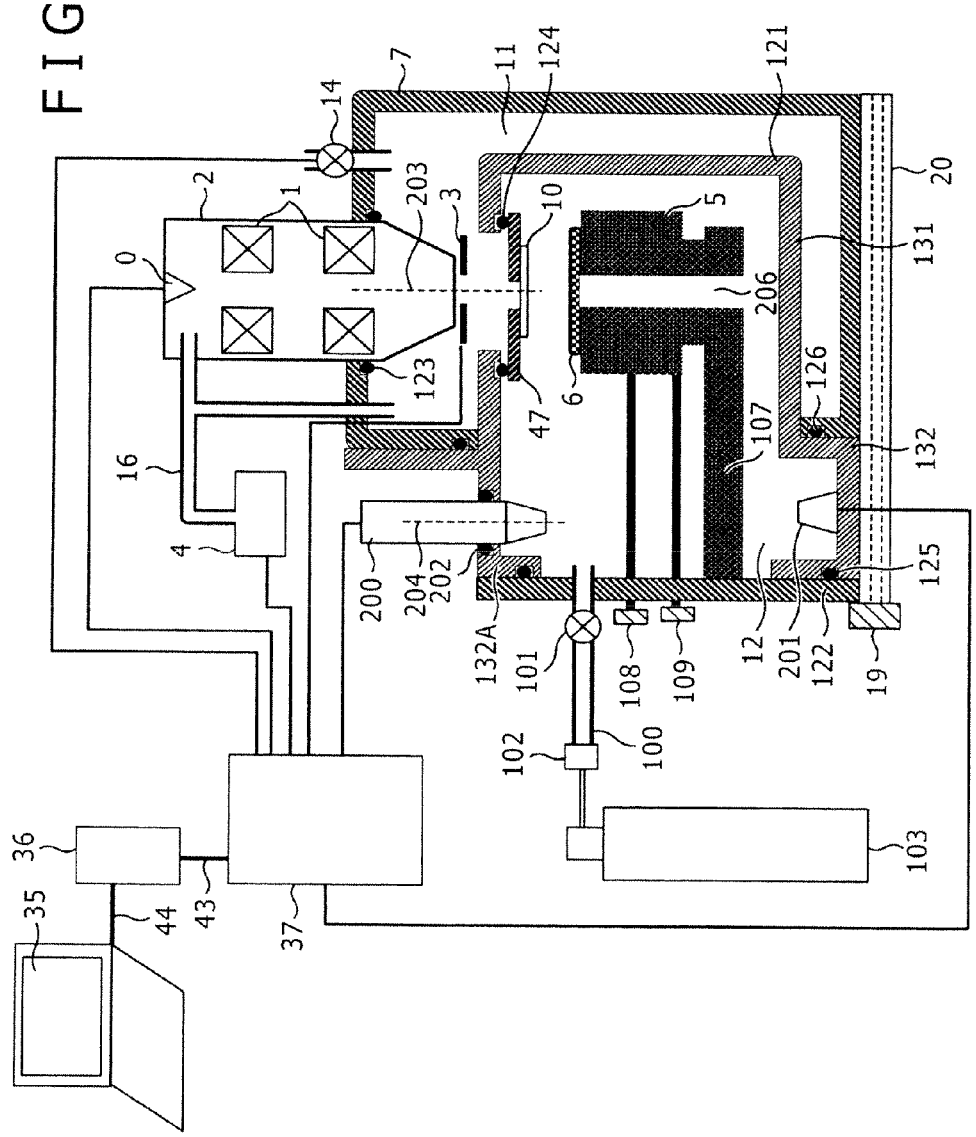
FIG. 4 is a general schematic diagram of an observation apparatus as a charged-particle microscope equipped with an optical microscope in a fourth embodiment.

A fourth embodiment will be described. FIG. 4 shows a general schematic diagram of an observation apparatus (inspection apparatus) as a charged-particle microscope equipped with an optical microscope in the fourth embodiment. The fourth embodiment differs from the second embodiment generally in that a light source 201 of an optical microscope is disposed below a sample 6, and that a sample stage 5 as a sample mount section is provided with a cavity section 206 as a transmission section through which light from the light source 201 can be transmitted. In the following description, descriptions of the same parts as those in the second embodiment will be omitted as far as possible.

In the case where the sample 6 is not transparent, it is necessary for the light source 201 to cast light onto the sample 6 from above. In the case where the sample 6 is transparent or transmissive to light, the light source 201 may be disposed below the sample 6, whereby an optical microscopic image can be obtained through transmission of light through the sample 6. Preferably, as shown in FIG. 4, the light source 201 is disposed below the sample stage 5. In this case, the sample stage 5 is provided with the cavity section 206 so that light can be transmitted therethrough.

Incidentally, the optical microscope may be configured so that it can be attached and detached. In the case where the optical microscope is detached from a holding section 132A, it is preferable that the place where the microscope has been disposed is covered with a cover (lid) or the like so that the outside of the apparatus and the inside of a second space 12 can be separated from each other on an atmosphere basis.

Fifth Embodiment

Figure 5:
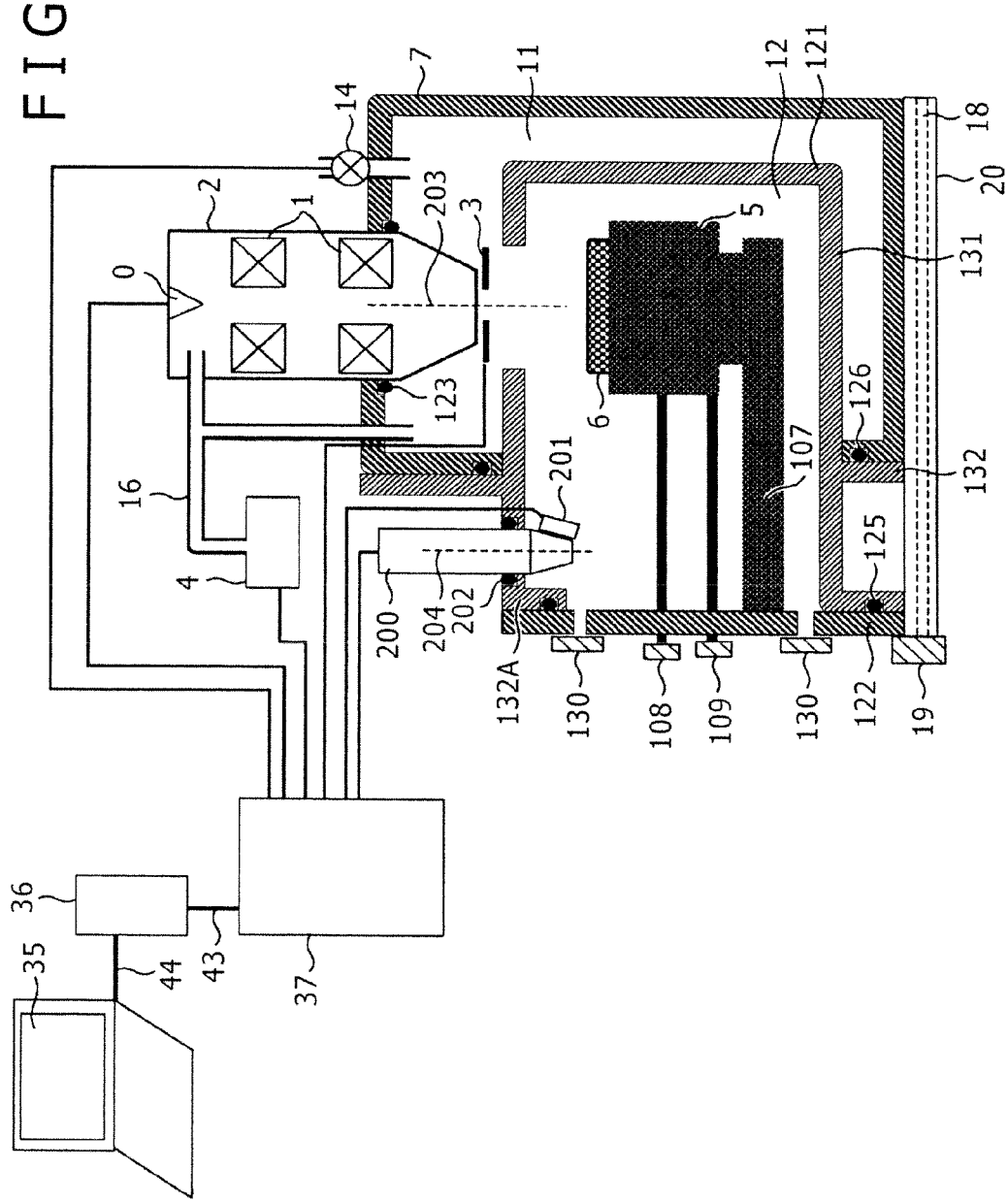
FIG. 5 is a general schematic diagram of an observation apparatus as a charged-particle microscope equipped with an optical microscope in a fifth embodiment.

A fifth embodiment will be described. FIG. 5 shows a general schematic diagram of an observation apparatus (inspection apparatus) as a charged-particle microscope equipped with an optical microscope in the fifth embodiment. The fifth embodiment differs from the second embodiment generally in that it shows a mode where the apparatus is used as a high-vacuum SEM equipped with an optical microscope. In the following description, descriptions of the same parts as those in the second embodiment will be omitted as far as possible.

As shown in this embodiment, the observation apparatus (inspection apparatus) according to the present invention can also be used as a high-vacuum SEM equipped with an optical microscope.

FIG. 5 shows a charged-particle microscope equipped with an optical microscope in the state where attachment positions of a gas supply pipe 100 and a pressure regulation valve 104 are closed with cover members 122, after the gas supply pipe 100 and the pressure regulation valve 104 are detached from a cover member 122, in the condition where the cover member 122 is fixed to a second casing 121. When a thin film holding member 47 is preliminarily detached from the second casing 121 before or after this operation, a first space 11 and a second space 12 can be made to communicate with each other, so that the inside of the second casing can be evacuated by a vacuum pump 4. This enables observation under a high-vacuum SEM in the state wherein the second casing 121 is kept attached.

Incidentally, as a modification of the configuration shown in FIG. 5, a configuration may be adopted wherein the second casing 121 with the thin film holding member 47 attached thereto and the optical microscope are dismounted entirely and the cover member 122 is fixed directly to a mating surface of a first casing 7.

This configuration enables the first space 11 and the second space 12 to communicate with each other, and enables the inside of the second casing 121 to be evacuated by the vacuum pump 4. Incidentally, this configuration is the same as the configuration of a general SEM apparatus.

As has been mentioned above, in this embodiment, a sample stage, a control knob 108 and a control knob 109 therefor, the gas supply pipe 100, and the pressure regulation valve 104 are all attached to the cover member 122 in a concentrated fashion. Therefore, the user of the apparatus can carry out operations of the control knob 108 and the control knob 109, an operation of replacing the sample, and operations of attaching/detaching the gas supply pipe 100 and the pressure regulation valve 104, on the same surface of the first casing. Accordingly, operability of the apparatus is extremely enhanced as compared with a scanning electron microscope of an ordinary configuration wherein the above-mentioned components are attached to different surfaces of a sample chamber in a scattered manner.

Sixth Embodiment

Figure 6:
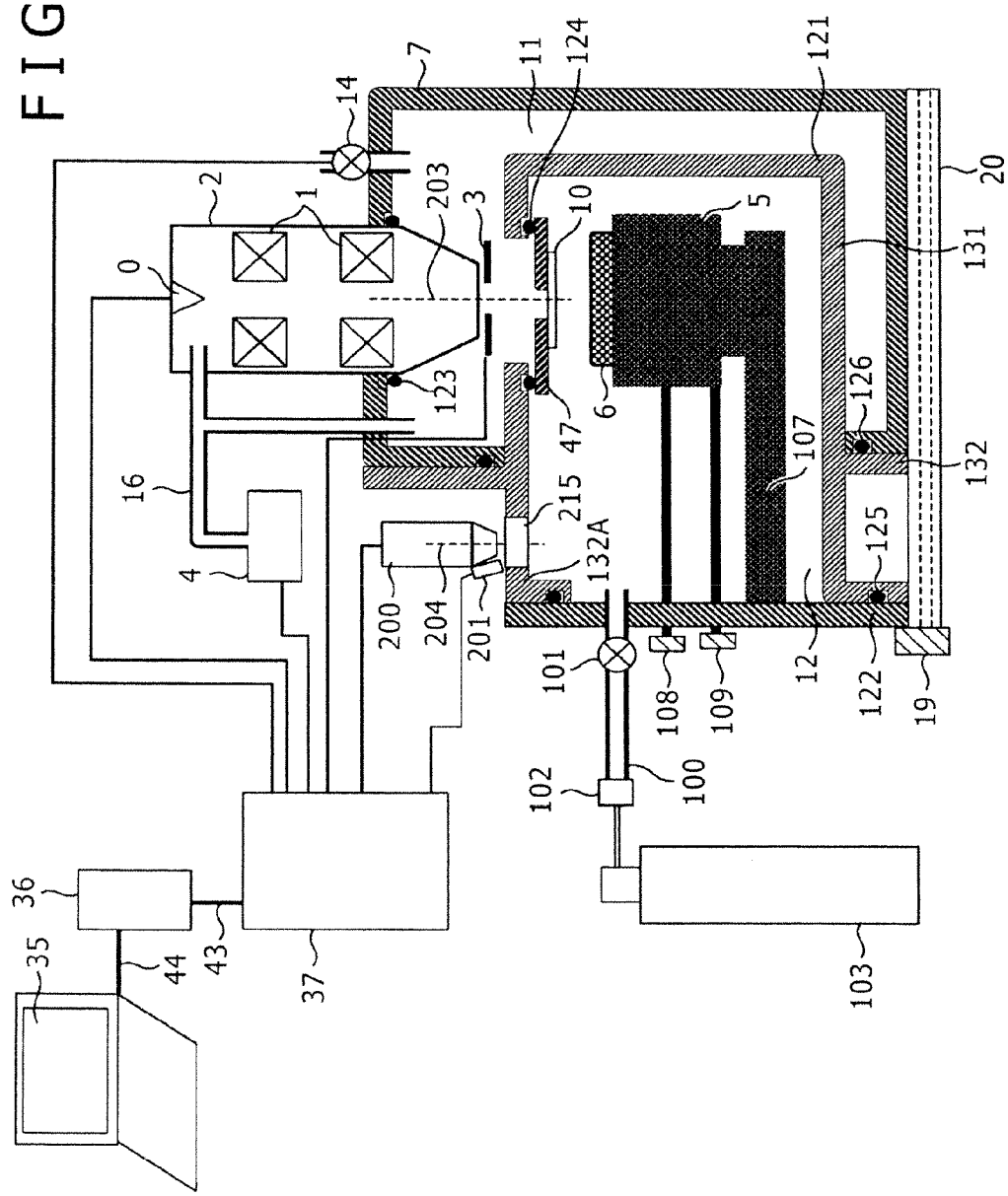
FIG. 6 is a general schematic diagram of an observation apparatus as a charged-particle microscope equipped with an optical microscope in a sixth embodiment.

A sixth embodiment will be described. FIG. 6 shows a general schematic diagram of an observation apparatus (inspection apparatus) as a charged-particle microscope equipped with an optical microscope in the sixth embodiment. The sixth embodiment differs from the second embodiment generally in that the optical microscope is disposed outside the apparatus, and a holding section 132A of a second casing 121 is provided with a window 215 at such a position as to face a lens-barrel 200 of the optical microscope. In the following description, descriptions of the same parts as those in the second embodiment will be omitted as far as possible.

As shown in FIG. 6, in the present embodiment, the lens-barrel 200 and a light source of the optical microscope are all disposed outside the apparatus, and the holding section 132A of the second casing 121 is at least provided with the window 215 permitting light to pass therethrough.

In general optical microscopes, observation at a higher magnification can be performed as the distance between the objective lens and the sample is shorter. Therefore, the configurations described in the first to fifth embodiments, for example, the configurations shown in FIGS. 1 to 5 provide higher optical microscope resolutions and are therefore more preferable, as compared with the arrangement of the lens-barrel 200 in this embodiment. However, in the configuration shown in FIG. 6, the optical microscope can be wholly disposed outside the apparatus (outside a second space 12). Therefore, labor for shielding the second casing from the outside air on an atmosphere basis by a seal member 202 or the like can be omitted; thus, a simpler configuration can be obtained. Incidentally, in the case where a sample 6 is a transparent or light-transmitting member, a light source 201 may be disposed below a sample stage 5, as shown in FIG. 4.

Seventh Embodiment

Figure 7:
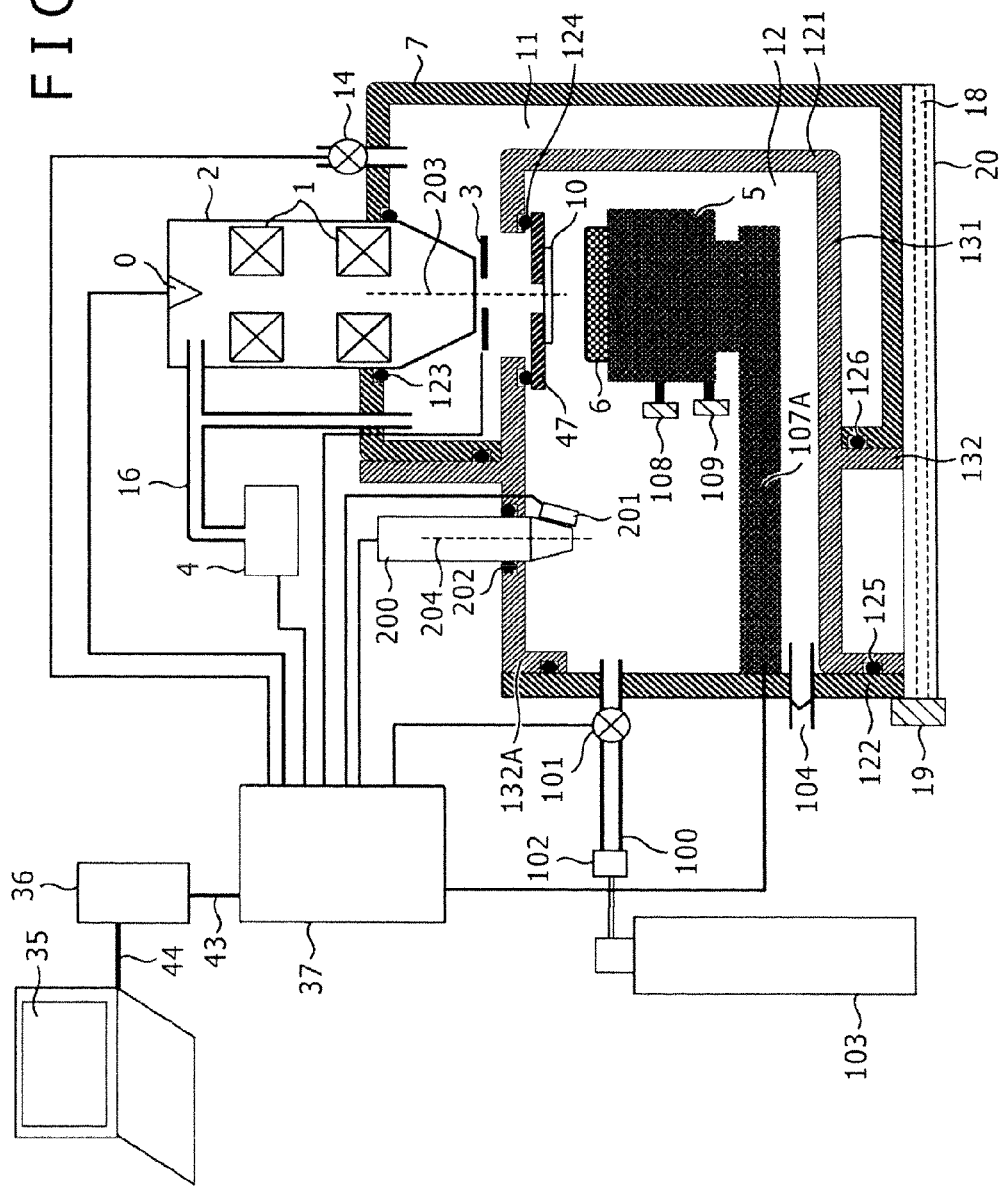
FIG. 7 is a general schematic diagram of an observation apparatus as a charged-particle microscope equipped with an optical microscope in a seventh embodiment.

A seventh embodiment will be described. FIG. 7 shows a general schematic diagram of an observation apparatus (inspection apparatus) as a charged-particle microscope equipped with an optical microscope in the seventh embodiment. The seventh embodiment is a modification of the second embodiment. The seventh embodiment differs from the second embodiment generally in that a sample stage moving mechanism 107A for moving a sample stage 5 as a sample mount section between the optical axis 204 of a lens-barrel 200 and the optical axis 203 of an electron microscope is provided in place of the support plate 107, and that a second space 12 is so large that a holding section 132A of a second casing 121 can be moved toward the side of the optical axis 204 of the lens-barrel 200 relative to the sample stage 5.

The sample stage moving mechanism 107A as a moving mechanism is so configured that signals for driving the sample stage moving mechanism 107A so as to move the sample stage 5 are transferred (on a data basis) between the moving mechanism and a lower-level control section 37 through a communication line 43. This moving mechanism is configured at least so that the sample stage 5 can be moved between a first position where a sample 6 is irradiated with a primary charged-particle beam radiated from a charged-particle optical column 2 and a second position where light from the sample 6 is detected by a lens-barrel 200 of the optical microscope.

After observation of the sample 6 under the optical microscope, the sample stage 5 is moved by an amount equivalent to the above-mentioned predetermined distance by the sample stage moving mechanism 107A, whereby the same part of the sample 6 can be observed by both the optical microscope and the electron microscope.

In addition, the same part of the sample 6 can be observed by the two types of microscopes from the generally same direction, unlike the configuration wherein an optical microscope and an electron microscope are disposed opposite to each other as described in the cited Document 1. Thus, usability of the apparatus can be enhanced.

Besides, as above-mentioned, each of an air atmosphere at 1 atm, a gas atmosphere and a vacuum atmosphere can be established inside the second casing 121. Therefore, observation under the optical microscope and observation under the electron microscope can be alternately carried out under various atmosphere conditions.

Incidentally, in this embodiment the apparatus can also be applied to the above-described third to sixth embodiments.

Eighth Embodiment

Figure 8:
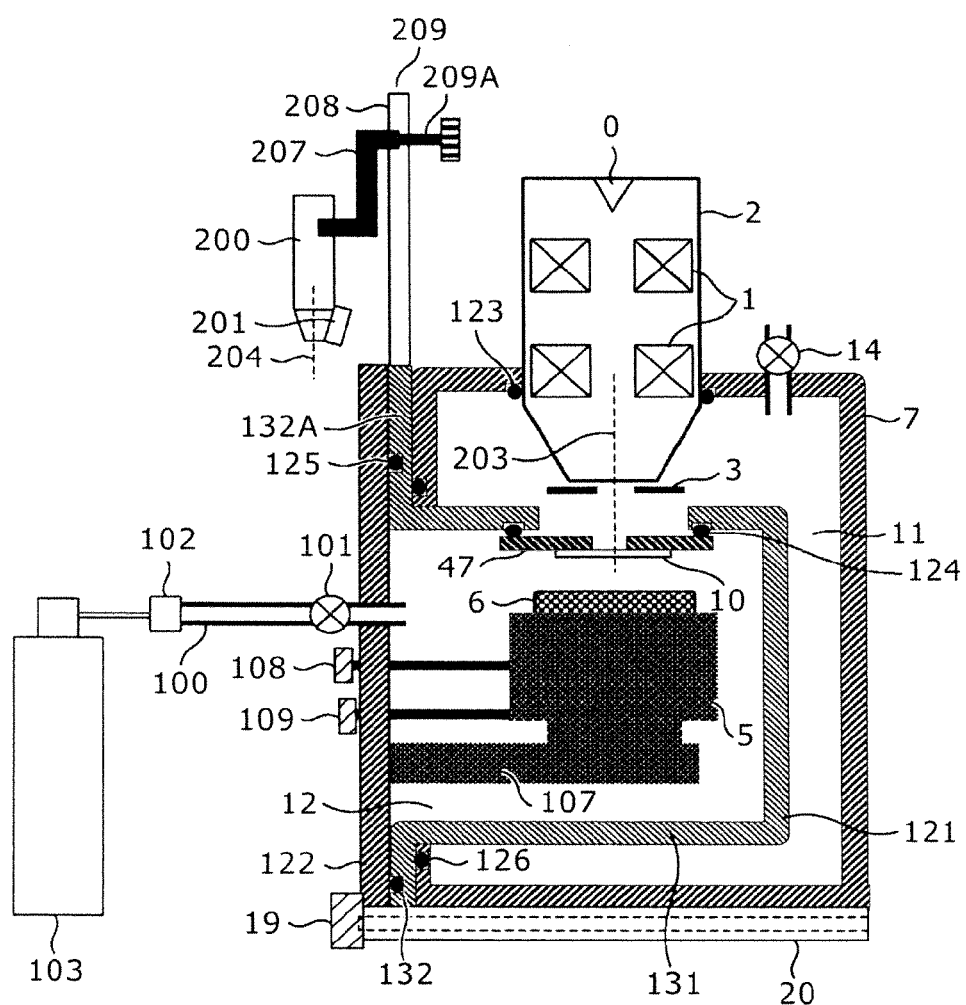
FIG. 8 is a general schematic diagram of an observation apparatus as a charged-particle microscope equipped with an optical microscope in an eighth embodiment.

An eighth embodiment will be described. FIG. 8 shows a general schematic diagram of an observation apparatus (inspection apparatus) as a charged-particle microscope equipped with an optical microscope in the eighth embodiment. The eighth embodiment is a modification of the sixth embodiment. The eighth embodiment differs from the sixth embodiment generally in that a holding section 132A of a second casing 121 is unified with a mating section 132 (or the mating section 132 functions also as the holding section 132A), and that the apparatus includes a position adjusting mechanism 209 by which a lens-barrel 200 of the optical microscope is moved away from and toward a sample 6 (in the vertical direction). In the following description, descriptions of the same parts as those in the sixth embodiment will be omitted as far as possible. As illustrated in FIG. 8, the holding section 132A of the second casing 121 is unified with the mating section 132. The holding section 132A is provided with the position adjusting mechanism 209 by which the optical microscope (the lens-barrel 200 and a light source 201) is moved away from and toward the sample 6 (in the vertical direction). The position adjusting mechanism 209 includes a holder 207 for holding the optical microscope, a support rod 208 for supporting the holder, and an adjustment section 209A by which the position in the vertical direction of the holder 207 on the support rod 208 can be adjusted.

Figure 9:
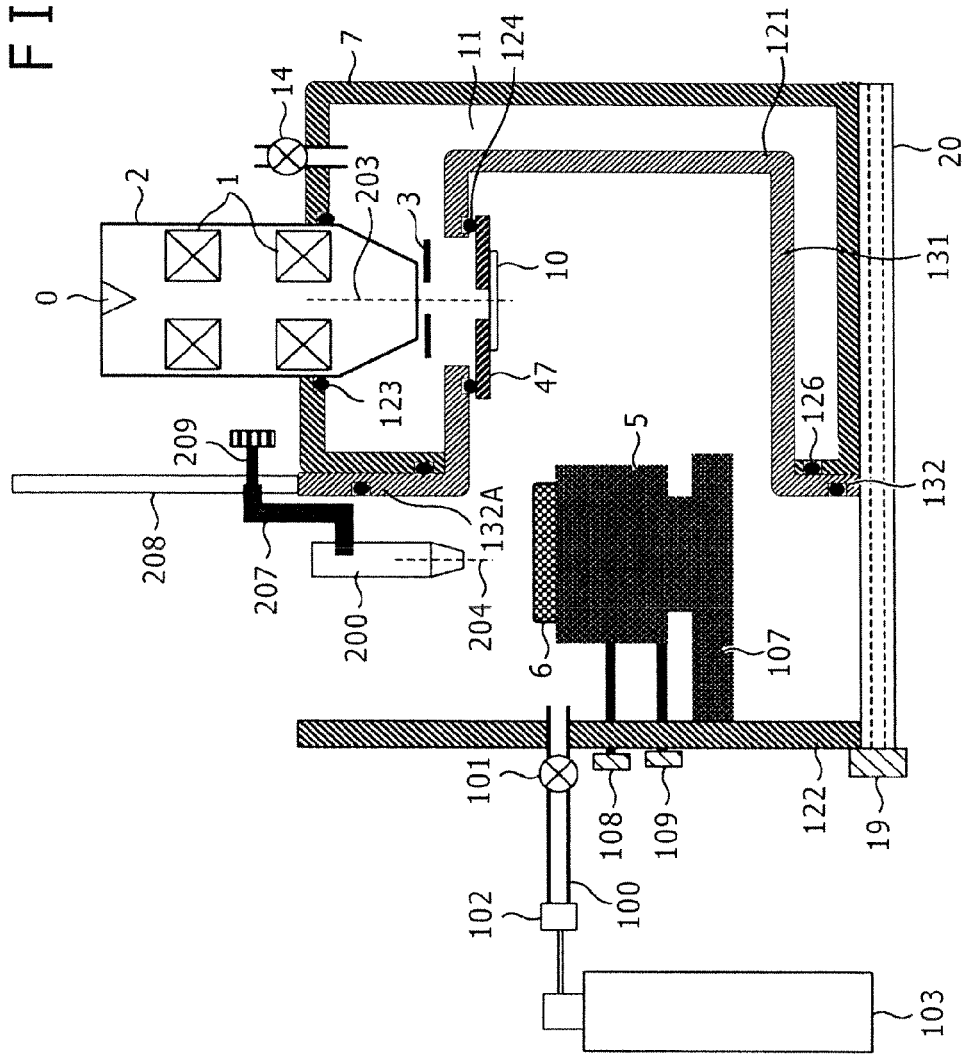
FIG. 9 is a general schematic diagram of an observation apparatus as a charged-particle microscope equipped with an optical microscope in an eighth embodiment, in the state where a sample stage has been drawn out together with a cover member.

FIG. 9 shows a configuration wherein a sample stage 5 has been drawn out together with a cover member 122. After the sample stage 5 is drawn out, the optical microscope is moved toward the sample 6, up to a position where the sample 6 can be observed, by use of the position adjusting mechanism 209, and observation is conducted. At the time of closing the cover member 122, the optical microscope is moved by the position adjusting mechanism 209 so that the position of the lower end of the optical microscope is changed to be above the upper end of the cover member 122, whereby observation is enabled. In the case of this configuration, a mating section 132 of the second casing 121 is provided, for example, with a threaded hole. Attachment of the support rod 208 to the threaded hole makes it possible to mount the optical microscope. On the contrary, detachment of the support rod 208 from the threaded hole makes it possible to dismount the optical microscope. Thus, mounting and dismounting of the optical microscope are facilitated. Consequently, the structure of the second casing 121 can be made very simple, as compared with that in the configuration according to the second embodiment. Incidentally, the optical microscope may be supported by the first casing 7, or may be supported by the cover member 122.

Ninth Embodiment

Figure 10A:
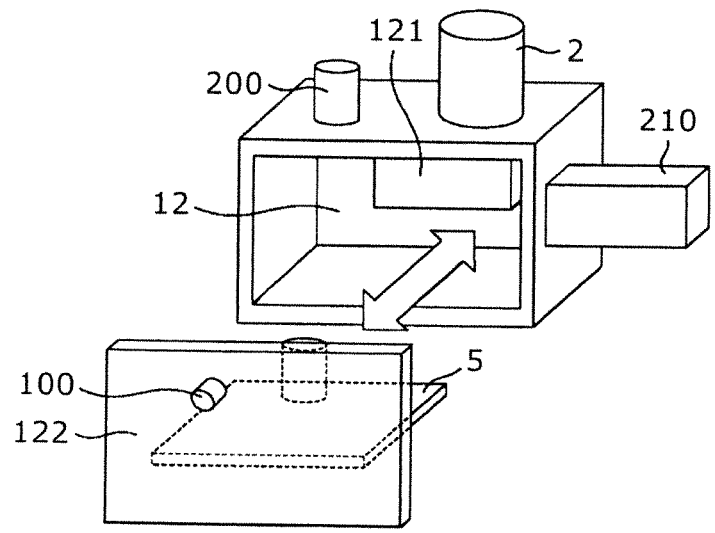
FIG. 10a is a general schematic diagram of an observation apparatus as a charged-particle microscope equipped with an optical microscope in a ninth embodiment.
Figure 10B:
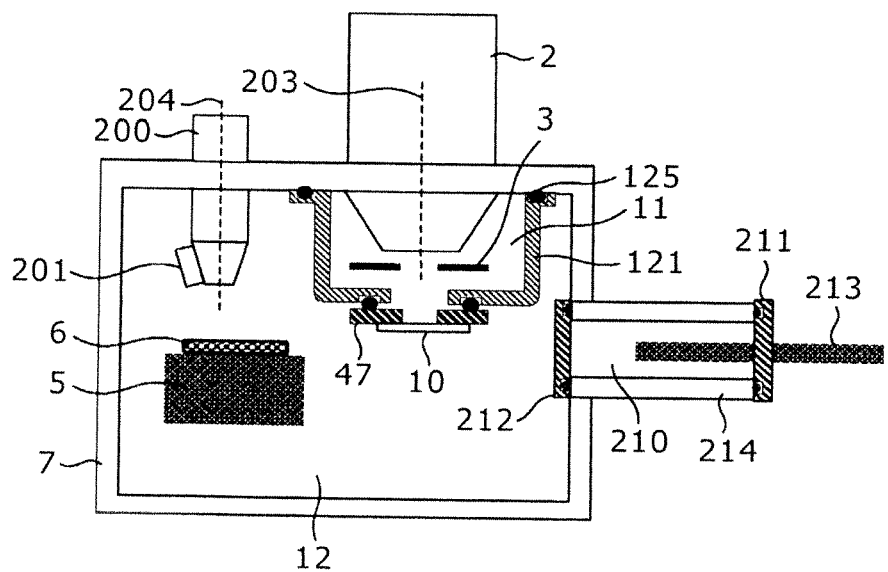
FIG. 10b is a general schematic diagram of an observation apparatus as a charged-particle microscope equipped with an optical microscope in a ninth embodiment.

A ninth embodiment will be described. FIGS. 10a and 10b each show a general schematic diagram of an observation apparatus (inspection apparatus) as a charged-particle microscope equipped with an optical microscope in the ninth embodiment. As shown in FIGS. 10a and 10b, the ninth embodiment is a configuration example wherein the relationship of the arrangement of a cover member 122 (the moving direction of a sample stage 5) relative to the arrangement of a charged-particle optical column 2 of the charged-particle microscope and a lens-barrel 200 of the optical microscope is different from that in the above-described embodiments. The direction of detaching the sample stage 5 is horizontal and perpendicular to the direction in which the charged-particle optical column 2 and the lens-barrel 200 of the optical microscope are aligned. Thus, the charged-particle optical column 2 and the lens-barrel 200 of the optical microscope are aligned in such a direction that both of them face in the direction in which the sample stage 5 is mounted into and dismounted from a second space 12.

In the following description, descriptions of the same parts as those in the above embodiments will be omitted as far as possible. As illustrated in FIGS. 10a and 10b, the second casing 121 is configured so that a thin film 10 can be disposed thereon. In the condition where the cover member 122 is opened and a taking-out port for taking out the sample stage 5 is open, the second casing 121 is so disposed as to cover the lower side of the charged-particle optical column 2. A seal member 125 is provided between the upper end of the second casing 121 and the lower surface of an upper portion of a first casing 7. A first space 11 and a second space 12 are separated from each other on an atmosphere basis by the second casing 121. Since the charged-particle optical column 2 and the lens-barrel 200 of the optical microscope are aligned in such a direction that both of them face the taking-out port for taking out the sample stage 5, maintenance of the charged-particle optical column 2 and the lens-barrel 200 of the optical microscope can be easily carried out in the condition where the cover member 122 is opened and the taking-out port for taking out the sample stage 5 is open.

Incidentally, the second casing 121 may be screwed to the first casing 7 from the lower side in the figures, or may be screwed to the first casing 7 from the side of the upper surface of an upper portion of the first casing 7.

The configuration shown in FIGS. 10a and 10b ensures that observation under the electron microscope in a state wherein the pressure inside the second space 12 is higher than the pressure inside the first space 11 can be provided by simply mounting the second casing 121. Preferably, the optical axis 204 of the lens-barrel 200 of the optical microscope and the optical axis 203 of the charged-particle optical column 2 are set parallel to each other. This enhances the possibility that the same part of the sample can be observed under the two types of microscopes from the same direction. Incidentally, the optical axis 204 of the lens-barrel 200 and the optical axis 203 of the electron microscope may be disposed obliquely to each other, insofar as the same part of the sample is permissible to be observed under the two types of microscopes from generally the same direction.

In addition, an attachable-and-detachable structure may be adopted so that observation under the charged-particle microscope can be performed even when the optical microscope has been detached.

Preferably, as illustrated in FIGS. 10a and 10b, a casing 214 defining a sample introduction chamber 210 may be provided. In this case, preferably, a configuration may be adopted wherein the sample stage 5 and the cover member 122 are always fixed and the sample 6 can be carried through the sample introduction chamber 210 into the second space 12. As shown in FIG. 10b, the sample introduction chamber 210 is preferably provided with a door 211, a door 212, and a sample introducing rod 213. Incidentally, the optical microscope may be provided in the sample introduction chamber 210.

Now, operation in the case where the sample introduction chamber 210 is provided will be described below.

First, the door 211 is opened, and a sample 6 or a sample holder with the sample 6 mounted thereon is disposed inside the sample introduction chamber 210. Thereafter, the door 211 is closed, and the door 212 is opened. Then, the sample 6 or the sample holder with the sample 6 held thereon is carried onto the sample stage 5 by the sample introducing rod 213. This enables the sample 6 to be carried into the second space without detaching the cover member 122 provided with the sample stage 5.

This configuration is characterized in that the atmospheric air is not liable to mix into the atmosphere inside the second space 12 even when the sample 6 is replaced under the condition where a light-element gas or the like is supplied into the second space 12 by way of a gas supply port 100. Therefore, it is unnecessary to introduce a large amount of the light-element gas, at the time of replacement of the sample 6.

Consequently, the amount of the gas to be used and the frequency of gas supply can be largely reduced.

DESCRIPTION OF REFERENCE CHARACTERS

0: Charged-particle source
1: Optical lens
2: Charged-particle optical column
3: Detector
4: Vacuum pump
5: Sample stage
6: Sample
7: First casing
10: Thin film
11: First space
12: Second space
14: Leak valve
16: Vacuum piping
18: Support bar
19: Cover member supporting member
20: Bottom plate
35: Personal computer
36: Upper-level control section
37: Lower-level control section
43, 44: Communication line
47: Thin film holding member
100: Gas supply port
101: Gas control valve
102: Connection section
103: Gas cylinder
104: Pressure regulation valve
107: Support plate
108, 109: Control knob
121: Second casing
122, 130: Cover member
123, 124, 125, 126, 128, 202: Seal member
131: Main body section
132: Mating section
200: Lens-barrel
201: Light source
203, 204: Optical axis
205: Driving mechanism
206: Cavity section
207: Holder
208: Support rod
209: Position adjusting mechanism
210: Sample introduction chamber
211, 212: Door
213: Sample introducing rod
214: Casing
215: Window

The invention claimed is:

1. A sample observation method by using a charged particle beam apparatus comprising a charged particle optical column irradiating a charged particle beam, a vacuum chamber, and a sample chamber being capable of storing a sample, the method comprising:
   maintaining a pressure of the sample chamber higher than that of the vacuum chamber by a thin film which permits the charged particle beam to be transmitted;
   determining a relation between a height of a lower surface of the thin film and a height of a lower end of a lens barrel of an optical microscope;
   measuring a distance between the sample and the lens barrel; and
   setting a distance between the sample and thin film based on the relation and the distance.

2. The sample observation method according to claim 1, further comprising moving a sample mount section mounting the sample between a first position where the charged particle beam is irradiated to the sample and a second position where the sample is observed by the optical microscope.

3. The sample observation method according to claim 1, wherein the charged particle beam apparatus comprises a sample mount section mounting the sample, and
   wherein the sample mounted on the sample mount section is observed by both of the charged particle beam apparatus and the optical microscope.

* * * * *